United States Patent
Wang

(10) Patent No.: US 10,211,342 B2
(45) Date of Patent: Feb. 19, 2019

(54) THIN FILM TRANSISTOR AND FABRICATION METHOD THEREOF, ARRAY SUBSTRATE, AND DISPLAY PANEL

(71) Applicant: BOE TECHNOLOGY GROUP CO., LTD., Beijing (CN)

(72) Inventor: Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/564,055

(22) PCT Filed: May 10, 2017

(86) PCT No.: PCT/CN2017/083708
§ 371 (c)(1),
(2) Date: Oct. 3, 2017

(87) PCT Pub. No.: WO2018/000947
PCT Pub. Date: Jan. 4, 2018

(65) Prior Publication Data
US 2018/0204949 A1 Jul. 19, 2018

(30) Foreign Application Priority Data
Jun. 28, 2016 (CN) .......................... 2016 1 0495890

(51) Int. Cl.
*H01L 29/786* (2006.01)
*H01L 27/12* (2006.01)
(Continued)

(52) U.S. Cl.
CPC .... *H01L 29/78606* (2013.01); *H01L 27/1225* (2013.01); *H01L 27/1255* (2013.01);
(Continued)

(58) Field of Classification Search
CPC ............. H01L 27/1225; H01L 27/1288; H01L 27/3248; H01L 27/3762
See application file for complete search history.

(56) References Cited

U.S. PATENT DOCUMENTS

2007/0148456 A1* 6/2007 Shim ................. H01L 21/76841
428/375
2010/0276685 A1* 11/2010 Itagaki ................ H01L 29/7869
257/43
(Continued)

FOREIGN PATENT DOCUMENTS

| CN | 104900533 A | 9/2015 |
| CN | 105575819 A | 5/2016 |

(Continued)

OTHER PUBLICATIONS

First Chinese Office Action dated Jan. 26, 2018.
Search Report and Written Opinion dated Jul. 20, 2017 from State Intellectual Property Office of the P.R. China.

*Primary Examiner* — Phuc T Dang
(74) *Attorney, Agent, or Firm* — Dilworth & Barrese, LLP; Michael J. Musella, Esq.

(57) ABSTRACT

A thin film transistor and a fabrication method thereof, an array substrate, and a display panel are provided. The fabrication method of the thin film transistor includes: forming an active layer on a base substrate, the active layer including a channel region; forming an amorphous carbon layer on a region of the active layer other than the channel region; and forming a source electrode and a drain electrode on the amorphous carbon layer, the source electrode and the drain electrode being respectively electrically connected with the active layer through the amorphous carbon layer.

15 Claims, 5 Drawing Sheets

(51) Int. Cl.
*H01L 27/32* (2006.01)
*H01L 29/49* (2006.01)

(52) U.S. Cl.
CPC ...... *H01L 27/1288* (2013.01); *H01L 27/3248* (2013.01); *H01L 27/3262* (2013.01); *H01L 29/4908* (2013.01); *H01L 29/786* (2013.01); *H01L 29/7869* (2013.01)

(56) References Cited

U.S. PATENT DOCUMENTS

| | | | |
|---|---|---|---|
| 2014/0124769 | A1 | 5/2014 | Kang et al. |
| 2015/0144943 | A1 | 5/2015 | Seo et al. |
| 2015/0333111 | A1* | 11/2015 | Sato .................... H01L 27/3246 257/40 |
| 2016/0336458 | A1* | 11/2016 | Gao .................... H01L 27/1225 |
| 2016/0380105 | A1* | 12/2016 | Wang .................. H01L 29/7869 257/43 |

FOREIGN PATENT DOCUMENTS

| | | |
|---|---|---|
| CN | 105977164 A | 9/2016 |
| JP | 09199728 A | 7/1997 |
| JP | 09252141 A | 9/1997 |
| JP | 201108882 A | 6/2011 |
| KR | 1020150061077 A | 6/2015 |

* cited by examiner

THIN FILM TRANSISTOR AND FABRICATION METHOD THEREOF, ARRAY SUBSTRATE, AND DISPLAY PANEL

TECHNICAL FIELD

Embodiments of the present disclosure relate to a thin film transistor and a fabrication method thereof, an array substrate, and a display panel.

BACKGROUND

At present, a liquid crystal display (LCD), an electroluminescence (EL) display, an electronic paper and other display devices are well known. These display devices have a thin film transistor (TFT) to turn on or turn off a pixel. As shown in FIG. 1, the thin film transistor mainly comprises an active layer 1, a gate electrode 2, a source electrode 3 and a drain electrode 4 provided on a base substrate 0; a gate insulation layer 5 is provided between the active layer 1 and the gate electrode 2, the source electrode 3 and drain electrode 4 are arranged in a same layer, an insulation layer 6 is provided between the source electrode 3 and the drain electrode 4 and the gate electrode 2, and the source electrode 3 and the drain electrode 4 are respectively electrically connected with the active layer 2. With respect to the thin film transistor shown in FIG. 1, in order to form a low-doped region P, the active layer 1 needs to be processed with H2, NH3, He, or other plasma. The low-doped region P is provided close to a channel region in the active layer 1, to prevent a thermal electron degradation effect.

As described above, during the plasma process for forming the low-doped region P, the active layer 1 is processed with a gas having a high hydrogen content such as H2, NH3 and the like; in this case, it is possible that the active layer 1 (particularly, in the case that the active layer is formed of a semiconductor oxide) becomes conductive due to an action of hydrogen, so as to destroy semiconductor characteristics of the active layer 1.

SUMMARY

According to embodiments of the disclosure, a fabrication method of a thin film transistor is provided. The method comprises: forming an active layer on a base substrate, the active layer including a channel region; forming an amorphous carbon layer on a region of the active layer other than the channel region; and forming a source electrode and a drain electrode on the amorphous carbon layer, the source electrode and the drain electrode being respectively electrically connected with the active layer through the amorphous carbon layer.

For example, the forming the amorphous carbon layer on the region of the active layer other than the channel region, includes: forming an amorphous carbon film on the active layer; and etching away a portion of the amorphous carbon film on the channel region of the active layer by a dry etching in an oxygen atmosphere.

For example, the forming the active layer on the base substrate and the forming the amorphous carbon layer on the region of the active layer other than the channel region, include: forming a semiconductor film on the base substrate, forming an amorphous carbon film on the semiconductor film, and forming a photoresist on the amorphous carbon film; exposing and developing the photoresist with a dual-tone mask to form a photoresist completely-removed region, a photoresist partially-reserved region and a photoresist completely-reserved region, the photoresist completely-reserved region corresponding to a region where the amorphous carbon layer is to be formed, the photoresist partially-reserved region corresponding to the channel region of the active layer, and the photoresist completely-removed region corresponding to other regions; removing the amorphous carbon film and the semiconductor film in the photoresist completely-removed region by using an etching process, to form the active layer; performing an ashing process, to remove the photoresist in the photoresist partially-reserved region and thin the photoresist in the photoresist completely-reserved region; performing another etching process, to remove the amorphous carbon film in the photoresist partially-reserved region, to form the amorphous carbon layer; and removing the photoresist in the photoresist completely-reserved region.

For example, after the forming the amorphous carbon layer and before the forming the source electrode and the drain electrode, the method further comprises: annealing the active layer.

For example, a temperature at which the active layer is annealed is 230° C. to 400° C.

For example, after the annealing the active layer and before the forming the source electrode and the drain electrode, the method further comprises: forming a gate insulation layer on the channel region of the active layer.

For example, a portion of the gate insulation layer that is in direct contact with the active layer is consisted of silicon dioxide.

For example, the gate insulation layer is formed to be higher than the amorphous carbon layer on the base substrate.

For example, after the forming the gate insulation layer and before the forming the source electrode and the drain electrode, the method further comprises: sequentially forming a gate electrode and an insulation layer on the base substrate on which the gate insulation layer is formed, the insulation layer including a via hole for electrically connecting the source electrode and the drain electrode with the amorphous carbon layer.

For example, a material for forming the active layer is an oxide semiconductor.

According to the embodiments of the disclosure, a thin film transistor is provided. The thin film transistor comprises: an active layer located on a base substrate, the active layer including a channel region; an amorphous carbon layer located on a region of the active layer other than the channel region; a source electrode and a drain electrode located on the amorphous carbon layer and respectively electrically connected with the active layer through the amorphous carbon layer.

For example, the thin film transistor further comprises: a gate insulation layer located on the channel region of the active layer, a gate electrode located on the gate insulation layer, and an insulation layer located on the gate electrode; the insulation layer being provided therein with a via hole, and the source electrode and the drain electrode being respectively electrically connected with the amorphous carbon layer located on the region of the active layer other than the channel region through the via hole formed in the insulation layer.

For example, a portion of the gate insulation layer that is in direct contact with the active layer is consisted of silicon dioxide.

For example, the gate insulation layer is formed to be higher than the amorphous carbon layer on the base substrate.

For example, the active layer is formed of an oxide semiconductor.

According to the embodiments of the disclosure, an array substrate is provided. The array substrate comprises the thin film transistor as described above.

According to the embodiments of the disclosure, a display panel is provided. The display panel comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Embodiments of the present disclosure provide a thin film transistor and a fabrication method thereof, an array substrate and a display panel, which avoid a plasma treatment process performed on an active layer, so as to avoid damages of the plasma treatment process to the active layer.

The thin film transistor and the fabrication method thereof, the array substrate and the display panel provided by the embodiments of the present disclosure are described in detail hereinafter in conjunction with the accompanying drawings.

It should be noted that thicknesses and sizes and shapes of respective layers and regions in the accompanying drawings do not reflect true proportions of the thin film transistor, but are only intended to illustrate content of the embodiments of the present disclosure.

Figure 1:
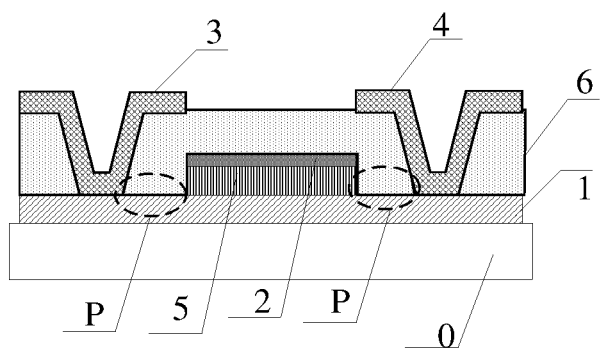
FIG. 1 is a structural schematic view illustrating a thin film transistor according to one technique.
Figure 2:
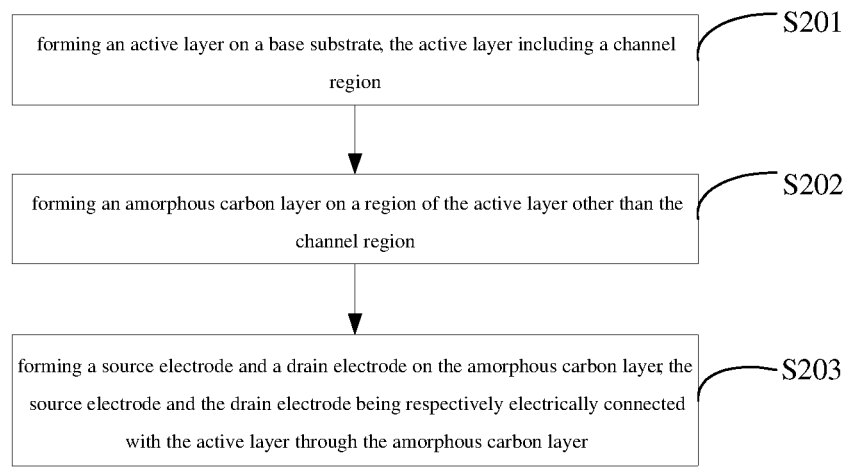
FIG. 2 is a flow schematic view illustrating a fabrication method of a thin film transistor provided by embodiments of the present disclosure.

With reference to FIG. 2, the embodiments of the present disclosure provide the fabrication method of the thin film transistor, and the method comprises:

S201: forming an active layer on a base substrate, the active layer including a channel region;

S202: forming an amorphous carbon layer on a region of the active layer other than the channel region;

For example, the amorphous carbon layer is a stack of graphene layers, or a layer formed of other carbon structure. For example, the amorphous carbon layer is electrically conductive.

S203: forming a source electrode and a drain electrode on the amorphous carbon layer, the source electrode and the drain electrode being respectively electrically connected with the active layer through the amorphous carbon layer.

The fabrication method of the thin film transistor provided by the embodiments of the present disclosure comprises forming the active layer on the base substrate, the method further comprises forming the amorphous carbon layer on the region of the active layer other than the channel region and forming the source electrode and the drain electrode on the amorphous carbon layer, the source electrode and the drain electrode are respectively electrically connected with the active layer through the amorphous carbon layer. The amorphous carbon layer has an electrical conductivity and a hydrogen absorption function. In the embodiments of the present disclosure, the amorphous carbon layer is formed on the region of the active layer other than the channel region, the amorphous carbon layer has the hydrogen absorption function, and thus it is possible that hydrogen in the region of the active layer other than the channel region is absorbed by the amorphous carbon layer, so as to avoid semiconductor characteristics of the active layer from being destroyed. In addition, the amorphous carbon layer has the electrical conductivity, and thus conductivity of the region of the thin film transistor immediately adjacent to the channel region is increased, and an ohmic contact characteristic between the source electrode and the drain electrode and the active layer is improved, so as to enhance the properties of the thin film transistor. In addition, by forming the amorphous carbon layer on the region of the active layer other than the channel region, the active layer avoids being treated by the plasma process, so as to avoid damage of the plasma treatment process to the active layer.

For example, the thin film transistor fabricated by the above-described fabrication method provided by the embodiments of the present disclosure is a thin film transistor of top-gate type.

For example, in the above-described fabrication method of the thin film transistor provided by the embodiments of the present disclosure, the step S202 of forming the amorphous carbon layer on the region of the active layer other than the channel region, includes: forming an amorphous carbon film on the active layer; and etching away a portion of the amorphous carbon film on the channel region of the active layer by using an etching process. For example, during forming the amorphous carbon film on the active layer, the amorphous carbon film is deposited by using a magnetron sputtering method, or any other suitable methods, which are not limited here. For example, the amorphous carbon layer and the active layer are formed simultaneously by using a single patterning process, or are formed separately by two patterning process, which are not limited here.

For example, the active layer and the amorphous carbon layer are formed simultaneously by using the single patterning process, in this case, the method comprises: forming a semiconductor film on the base substrate, forming the amorphous carbon film on the semiconductor film, and forming a photoresist on the amorphous carbon film; exposing and developing the photoresist with a dual-tone mask (e.g., a half-tone mask or a gray-tone mask) to form a photoresist completely-removed region, a photoresist partially-reserved region and a photoresist completely-reserved region, the photoresist completely-reserved region corresponding to a region where the amorphous carbon layer is to be formed, the photoresist partially-reserved region corresponding to the channel region of the active layer, and the photoresist completely-removed region corresponding to other regions; removing the amorphous carbon film and the semiconductor film in the photoresist completely-removed region by using an etching process, to form the active layer; performing an ashing process, to remove the photoresist in the photoresist partially-reserved region and thin the photoresist in the photoresist completely-reserved region; performing an etching process, to remove the amorphous carbon film in the photoresist partially-reserved region, to form the amorphous carbon layer; and removing the remaining photoresist.

For example, the active layer and the amorphous carbon layer are formed by two patterning processes, in this case, the method comprises: forming the semiconductor film on the base substrate, patterning the semiconductor film with a normal mask, to form the active layer; forming the amorphous carbon film on the active layer, and etching away the portion of the amorphous carbon film on the channel region of the active layer with another normal mask, to form the amorphous carbon layer.

For example, the semiconductor film is a semiconductor oxide film. For example, the semiconductor film is formed on the base substrate by using a deposition process. For example, in the case that the semiconductor oxide film is deposited, oxygen content is 15% to 30%. For example, the semiconductor oxide film is etched by a wet etching process.

For example, in the above-described fabrication method of the thin film transistor provided by the embodiments of the present disclosure, the etching away the portion of the amorphous carbon film on the channel region of the active layer by using the etching process, includes: etching away the portion of the amorphous carbon film on the channel region of the active layer by using a dry etching process in an oxygen atmosphere.

For example, in the above-described fabrication method of the thin film transistor provided by the embodiments of the present disclosure, after the etching away the portion of the amorphous carbon film on the channel region of the active layer by using the etching process, and before the forming the source electrode and the drain electrode, the method further comprises: annealing the active layer. Thereby, the active layer becomes more stable.

For example, in the above-described fabrication method of the thin film transistor provided by the embodiments of the present disclosure, the active layer is formed of the semiconductor oxide, and a temperature at which the active layer formed of the semiconductor oxide is annealed is 230° C. to 400° C. Thereby, the active layer formed of the semiconductor oxide becomes more stable.

For example, in the above-described fabrication method of the thin film transistor provided by the embodiments of the present disclosure, after the annealing the active layer, and before the forming the source electrode and the drain electrode, the method further comprises: forming a gate insulation layer on the channel region of the active layer. For example, a material for forming the gate insulation layer is silicon dioxide. In the case that the gate insulation layer is formed of silicon dioxide, a hydrogen gas in the active layer is absorbed by the silicon dioxide because the silicon dioxide has a hydrogen absorption function, which reduces hydrogen content in the active layer and avoids the active layer from being destroyed by hydrogen.

It should be noted that, in the embodiments of the present disclosure, the material for forming the gate insulation layer is not limited to silicon dioxide, and the gate insulation layer may be formed of silicon nitride and/or silicon oxynitride, which are not limited here.

For example, the gate insulation layer includes a stack structure of a silicon dioxide layer and a silicon nitride layer, or a stack structure of the silicon dioxide layer and a silicon oxynitride layer, or a stack structure of the silicon dioxide layer, the silicon nitride layer, and the silicon oxynitride layer; and in this case, the silicon dioxide layer is in direct contact with the active layer.

For example, in the above-described fabrication method of the thin film transistor provided by the embodiments of the present disclosure, the active layer is formed of the semiconductor oxide, and the semiconductor oxide is indium gallium zinc oxide and/or indium tin zinc oxide. Indium gallium zinc oxide and/or indium tin zinc oxide are both easily destroyed in an atmosphere of the hydrogen gas or other gases, so as to change from a semiconductor to a conductor. Therefore, semiconductor materials whose semiconductor characteristics are easily destroyed in the atmosphere of the hydrogen gas all belong to the protection scope of the embodiments of the present disclosure, which are not limited here.

For example, the gate insulation layer is formed to be higher than the amorphous carbon layer on the base substrate, to prevent a gate electrode subsequently formed on the gate insulation layer from being in contact with the amorphous carbon layer.

For example, in the above-described fabrication method of the thin film transistor provided by the embodiments of the present disclosure, after the forming the gate insulation layer, and before the forming the source electrode and the drain electrode, the method further comprises: sequentially forming the gate electrode and an insulation layer on the base substrate on which the gate insulation layer is formed; the insulation layer includes a via hole for electrically connecting the source electrode and the drain electrode with the amorphous carbon layer. For example, the gate electrode is made of any one or more of molybdenum (Mo), aluminum (Al) and copper (Cu), which are not limited here.

Hereinafter, the fabrication method of the thin film transistor provided by the embodiments of the present disclosure will be further described in detail, in conjunction with FIG. 3 and FIG. 4(a) to FIG. 4(g).

Figure 3:
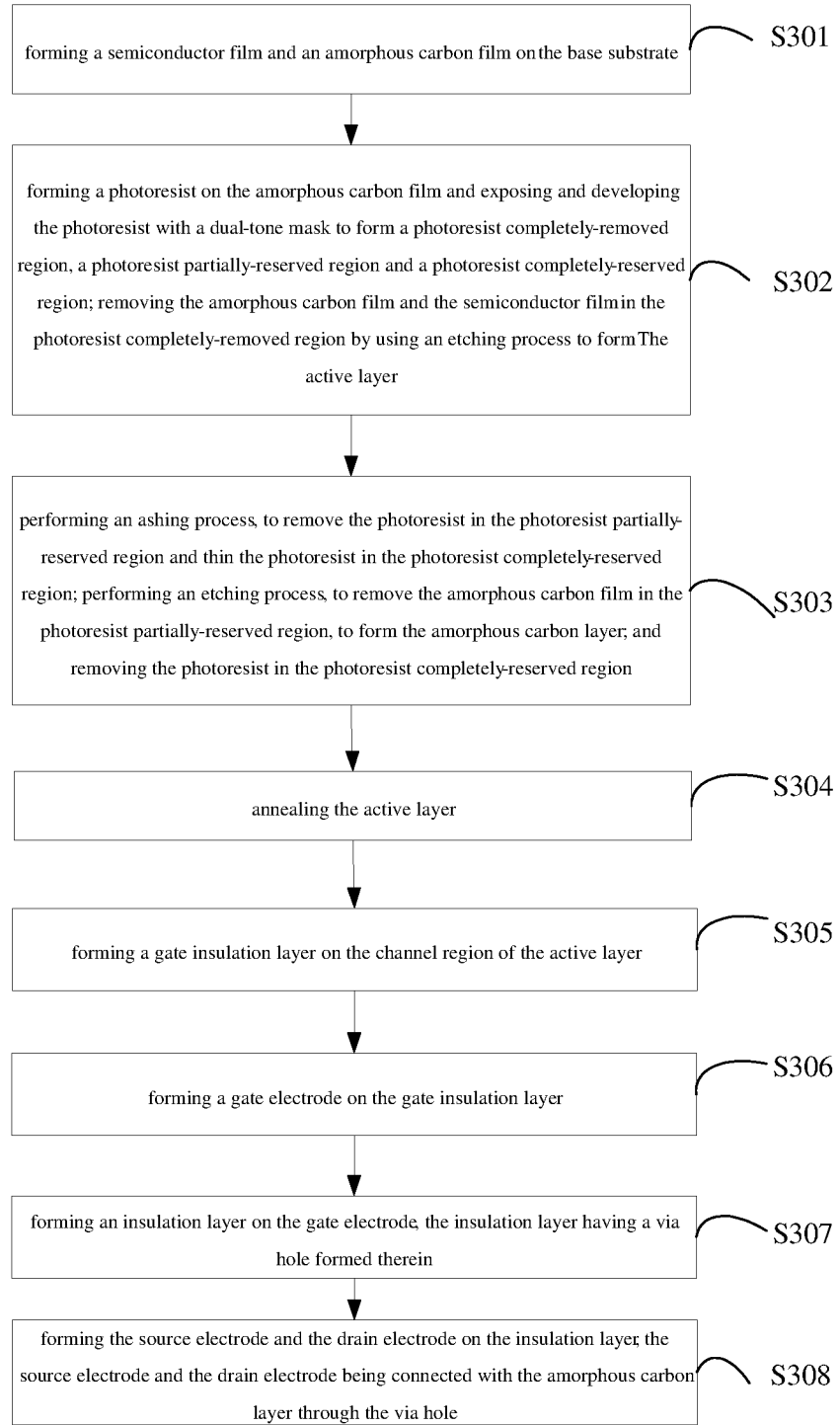
FIG. 3 is a more specific flow schematic view illustrating the fabrication method of the thin film transistor provided by the embodiments of the present disclosure.
Figure 4A:
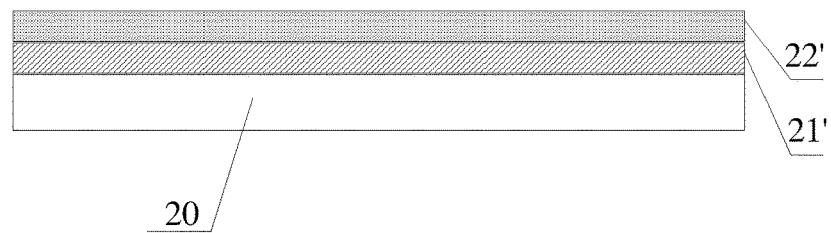
FIG. 4(a) to FIG. 4(g) are structural schematic views illustrating the fabrication method of the thin film transistor provided by the embodiments of the present disclosure.

With reference to FIG. 3, the fabrication method of the thin film transistor provided by the embodiments of the present disclosure comprises:

S301: forming the semiconductor film 21' and the amorphous carbon film 22' on the base substrate 20, as shown in FIG. 4(a).

For example, a thickness of the semiconductor film is 40 nm to 50 nm. For example, the semiconductor film is a semiconductor oxide film, and the semiconductor oxide film is fabricated in an atmosphere with oxygen content of 15% to 30%.

For example, the amorphous carbon film is deposited by magnetron sputtering method, and a thickness of the amorphous carbon film is 200 nm to 500 nm.

Figure 4B:
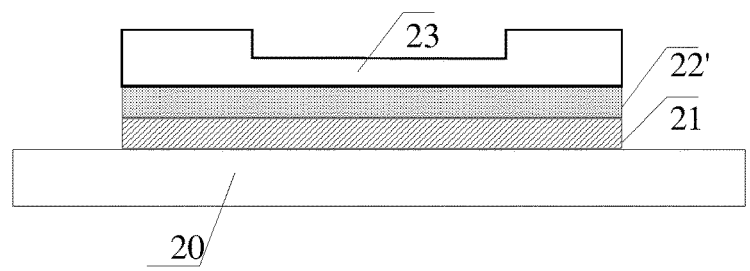

S302: forming the photoresist 23 on the amorphous carbon film 22' and exposing and developing the photoresist 23 with the dual-tone mask to form the photoresist completely-removed region, the photoresist partially-reserved region and the photoresist completely-reserved region, the photoresist completely-reserved region corresponding to the region where the amorphous carbon layer is to be formed, the photoresist partially-reserved region corresponding to the channel region of the active layer, and the photoresist completely-removed region corresponding to other regions; removing the amorphous carbon film 22' and the semiconductor film 21' in the photoresist completely-removed region by using the etching process, to form the semiconductor active layer 21, as shown in FIG. 4(b).

For example, the semiconductor film 21' is etched by using the wet etching process, and the amorphous carbon film 22' is etched by using the dry etching process.

Figure 4C:
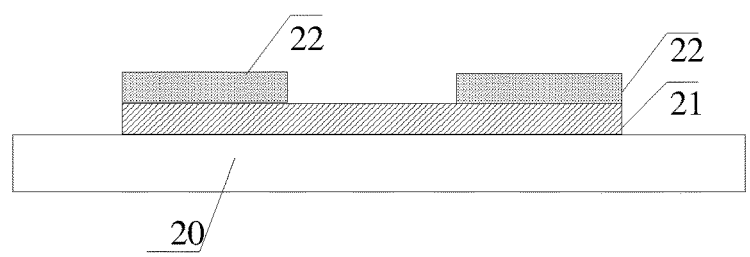

S303: performing the ashing process, to remove the photoresist 23 in the photoresist partially-reserved region and thin the photoresist 23 in the photoresist completely-reserved region; performing the etching process to remove the amorphous carbon film 22' in the photoresist partially-reserved region, to form the amorphous carbon layer 22; and removing the remaining photoresist 23, as shown in FIG. 4(c).

S304: annealing the active layer 21.

Figure 4D:
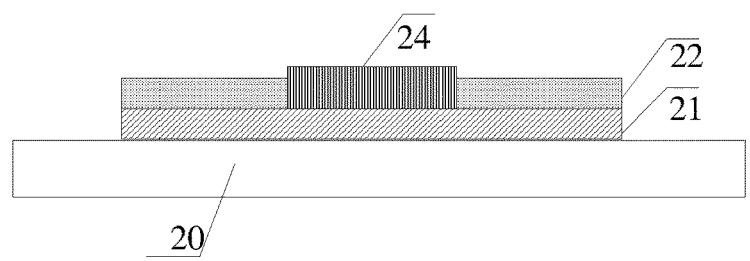

S305: forming the gate insulation layer 24 on the channel region of the active layer, as shown in FIG. 4(d).

For example, a portion of the gate insulation layer that is in direct contact with the active layer is consisted of the silicon dioxide.

For example, on the base substrate 20, the gate insulation layer 24 is formed to be higher than the amorphous carbon layer 22.

Figure 4E:
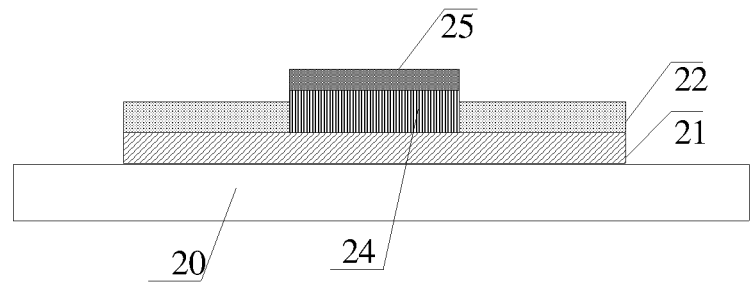

S306: forming the gate electrode 25 on the gate insulation layer 24, as shown in FIG. 4(e).

Figure 4F:
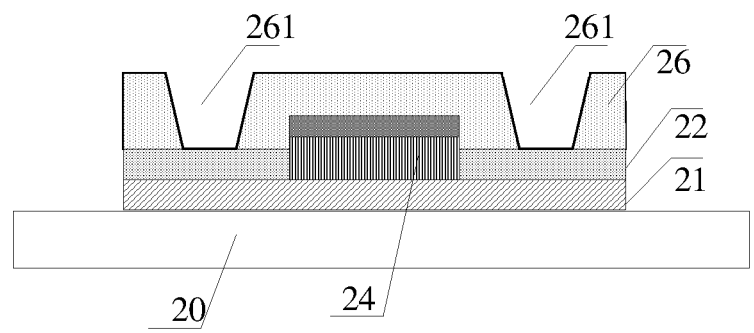

S307: forming the insulation layer 26 on the gate electrode 25, the insulation layer having the via hole 261 formed therein, as shown in FIG. 4(f).

Figure 4G:
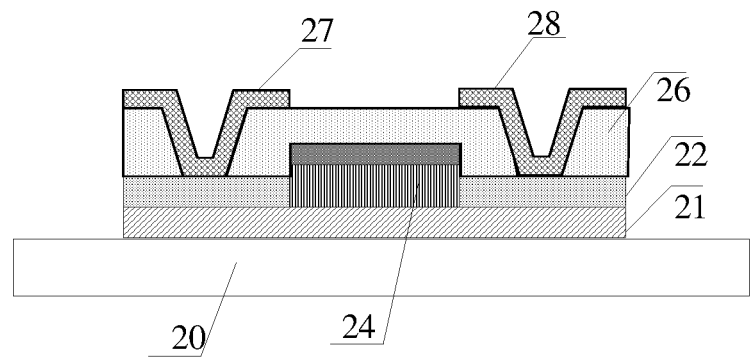

S308: forming the source electrode 27 and the drain electrode 28 on the insulation layer 26, the source electrode 27 and the drain electrode 28 being connected with the amorphous carbon layer 22 through the via hole 261, as shown in FIG. 4(g).

The thin film transistor is formed by the above-described steps, and the patterning process needs to be employed for forming each layer of the thin film transistor. The patterning process for example includes photolithography process, or includes printing, inkjet printing, and other process for forming a predetermined pattern. The photolithography process refers to a process including film formation, exposure, development, etching and so on to form a pattern by using photoresist, a mask, an exposure machine and so on.

In the fabrication method of the thin film transistor provided by the embodiments of the present disclosure, the amorphous carbon layer has the hydrogen absorption function and hydrogen gas in the active layer is absorbed, so as to avoid the active layer from being destroyed by the hydrogen gas. For example, the amorphous carbon layer is fabricated on the region of the active layer other than the channel region, so free H in the active layer is adsorbed, H content in the active layer is reduced and further the stability of the thin film transistor is enhanced. In addition, the amorphous carbon layer has the electrical conductivity, so conductivity of the region of the thin film transistor immediately adjacent to the channel region is increased, the ohmic contact characteristic between the source electrode and the drain electrode and the semiconductor active layer is improved, and the characteristics of the thin film transistor is improved. In addition, by forming the amorphous carbon layer on the region of the active layer other than the channel region, the active layer avoids being treated by plasma process, so as to avoid damage of the plasma treatment process to the active layer.

Figure 5:
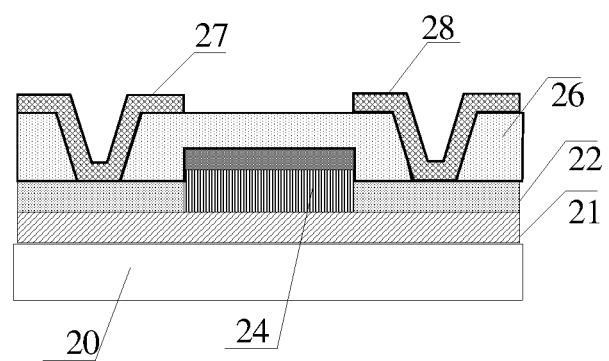
FIG. 5 is a structural schematic view illustrating a thin film transistor provided by the embodiments of the present disclosure.

The embodiments of the present disclosure further provide a thin film transistor; with reference to FIG. 5, the thin film transistor comprises: the active layer 21 on the base substrate 20, the amorphous carbon layer 22 on a region of the active layer other than the channel region 21, and the source electrode 27 and the drain electrode 28 located on the amorphous carbon layer 22 and electrically connected with the active layer through the amorphous carbon layer 22.

For example, the active layer 21 is formed of the semiconductor oxide. The semiconductor oxide is, for example, indium gallium zinc oxide and/or indium tin zinc oxide. Indium gallium zinc oxide and/or indium tin zinc oxide are both easily destroyed in the atmosphere of the hydrogen gas or other gases, so as to be changed from semiconductor to conductor. Therefore, semiconductor materials whose semiconductor characteristics are easily destroyed in the atmosphere of the hydrogen gas all belong to the protection scope of the embodiments of the present disclosure, which are not limited here.

For example, with reference to FIG. 5, the thin film transistor according to the embodiments of the present disclosure further comprises: the gate insulation layer 24 located on the channel region of the active layer 21, the gate electrode 25 located on the gate insulation layer 24, the insulation layer 26 located on the gate electrode 25, and the via hole located in the insulation layer 26. The source electrode 27 and the drain electrode 28 are respectively electrically connected with the amorphous carbon layer located on the region of the active layer other than the channel region through the via hole formed in the insulation layer.

For example, a material for forming the gate insulation layer is silicon dioxide. In the case that the gate insulation layer is formed of silicon dioxide, the hydrogen gas in the active layer is absorbed due to the hydrogen absorption function of silicon dioxide, which reduces hydrogen content in the active layer and avoids the active layer from being destroyed by hydrogen.

It should be noted that, in the embodiments of the present disclosure, the material for forming the gate insulation layer is not limited to silicon dioxide, and the gate insulation layer may be formed of silicon nitride and/or silicon oxynitride, which are not limited here.

For example, the gate insulation layer includes the stack structure of the silicon dioxide layer and the silicon nitride layer, or the stack structure of the silicon dioxide layer and the silicon oxynitride layer, or the stack structure of the silicon dioxide layer, the silicon nitride layer, and the silicon oxynitride layer; and in this case, the silicon dioxide layer is in direct contact with the active layer.

The embodiments of the present disclosure further provide an array substrate, comprising the above-described thin film transistor provided by the embodiments of the present disclosure.

The embodiments of the present disclosure further provide a display panel, comprising the above-described array substrate provided by the embodiments of the present disclosure.

The embodiments of the present disclosure provide the thin film transistor and the fabrication method thereof, the array substrate, and the display panel; the fabrication method of the thin film transistor comprises forming the active layer on the base substrate, the method further comprises forming the amorphous carbon layer on the region of the active layer other than the channel region and forming the source electrode and the drain electrode on the amorphous carbon layer, the source electrode and the drain electrode are respectively electrically connected with the active layer through the amorphous carbon layer. The amorphous carbon layer has the electrical conductivity and the hydrogen absorption function. In the embodiments of the present disclosure, the amorphous carbon layer is formed on the region of the active layer other than the channel region, the amorphous carbon layer has the hydrogen absorption function, and thus it is possible that hydrogen in the region of the active layer other than the channel region is absorbed by the amorphous carbon layer, so as to avoid semiconductor characteristics of the active layer from being destroyed. In addition, the amorphous carbon layer has the electrical conductivity, and thus conductivity of the region of the thin film transistor immediately adjacent to the channel region is increased, and an ohmic contact characteristic between the source electrode and the drain electrode and the active layer is improved, so as to enhance the properties of the thin film transistor. In addition, by forming the amorphous carbon layer on the region of the active layer other than the channel region, the active layer avoids being treated by the plasma process, so as to avoid damage of the plasma treatment process to the active layer.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201610495890.7 filed on Jun. 28, 2016, the present disclosure of which is incorporated herein by reference in its entirety as part of the present application.

The invention claimed is:

1. A fabrication method of a thin film transistor, comprising:
    forming an active layer on a base substrate, the active layer including a channel region;
    forming an amorphous carbon layer on a region of the active layer other than the channel region; and
    forming a source electrode and a drain electrode on the amorphous carbon layer, the source electrode and the drain electrode being respectively electrically connected with the active layer through the amorphous carbon layer,
    wherein, the forming the active layer on the base substrate and the forming the amorphous carbon layer on the region of the active layer other than the channel region, include:
    forming a semiconductor film on the base substrate, forming an amorphous carbon film on the semiconductor film, and forming a photoresist on the amorphous carbon film;
    exposing and developing the photoresist with a dual-tone mask to form a photoresist completely-removed region, a photoresist partially-reserved region and a photoresist completely-reserved region, the photoresist completely-reserved region corresponding to a region where the amorphous carbon layer is to be formed, the photoresist partially-reserved region corresponding to the channel region of the active layer, and the photoresist completely-removed region corresponding to other regions;
    removing the amorphous carbon film and the semiconductor film in the photoresist completely-removed region by using an etching process, to form the active layer;
    performing an ashing process, to remove the photoresist in the photoresist partially-reserved region and thin the photoresist in the photoresist completely-reserved region;
    performing another etching process, to remove the amorphous carbon film in the photoresist partially-reserved region, to form the amorphous carbon layer; and
    removing the photoresist in the photoresist completely-reserved region.

2. The method according to claim 1, wherein, after the forming the amorphous carbon layer and before the forming the source electrode and the drain electrode, the method further comprises: annealing the active layer.

3. The method according to claim 2, wherein, a temperature at which the active layer is annealed is 230° C. to 400° C.

4. The method according to claim 2, wherein, after the annealing the active layer and before the forming the source electrode and the drain electrode, the method further comprises:
    forming a gate insulation layer on the channel region of the active layer.

5. The method according to claim 4, wherein, a portion of the gate insulation layer that is in direct contact with the active layer is consisted of silicon dioxide.

6. The method according to claim 4, wherein, the gate insulation layer is formed to be higher than the amorphous carbon layer on the base substrate.

7. The method according to claim 4, wherein, after the forming the gate insulation layer and before the forming the source electrode and the drain electrode, the method further comprises:
    sequentially forming a gate electrode and an insulation layer on the base substrate on which the gate insulation layer is formed, the insulation layer including a via hole for electrically connecting the source electrode and the drain electrode with the amorphous carbon layer.

8. The method according to claim 1, wherein, a material for forming the active layer is an oxide semiconductor.

9. A thin film transistor, comprising:
    an active layer located on a base substrate, the active layer including a channel region;
    an amorphous carbon layer located on a region of the active layer other than the channel region; and
    a source electrode and a drain electrode located on the amorphous carbon layer and respectively electrically connected with the active layer through the amorphous carbon layer, wherein, the thin film transistor further comprises: a gate insulation layer, located on the channel region of the active layer, a gate electrode located on the gate insulation layer, and an insulation layer located on the gate electrode: the insulation layer is provided therein with a via hole, and the source electrode and the drain electrode are respectively electrically connected with the amorphous carbon layer located on the region of the active layer other than the channel region through the via hole formed in the insulation layer.

10. The thin film transistor according to claim 9, wherein, a portion of the gate insulation layer that is in direct contact with the active layer is consisted of silicon dioxide.

11. The thin film transistor according to claim 9, wherein, the gate insulation layer is formed to be higher than the amorphous carbon layer on the base substrate.

12. The thin film transistor according to claim 9, wherein, the active layer is formed of an oxide semiconductor.

13. An array substrate, comprising the thin film transistor according to claim 9.

14. A display panel, comprising the array substrate according to claim 13.

15. A thin film transistor, comprising:
an active layer located on a base substrate, the active layer including a channel region;
an amorphous carbon layer located on a region of the active layer other than the channel region; and
a source electrode and a drain electrode located on the amorphous carbon layer and respectively electrically connected with the active layer through the amorphous carbon layer,
wherein, the thin film transistor further comprises: a gate insulation layer located on the channel region of the active layer, and the gate insulation layer is formed to be higher than the amorphous carbon layer on the base substrate.

* * * * *